US007741650B2

(12) United States Patent
Chen

(10) Patent No.: US 7,741,650 B2
(45) Date of Patent: Jun. 22, 2010

(54) ILLUMINATING EQUIPMENT OF HIGH-POWER AND CLUSTERED LIGHT-EMITTING DIODES COUPLED TO HIGH EFFICIENCY HEAT-SPREADING AND HEAT-DISSIPATING MODULE

(75) Inventor: Jen-Shyan Chen, Hsinchu (TW)

(73) Assignee: Neobulb Technologies, Inc. (BN)

( * ) Notice: Subject to any disclaimer, the term of this patent is extended or adjusted under 35 U.S.C. 154(b) by 251 days.

(21) Appl. No.: 11/822,222

(22) Filed: Jul. 3, 2007

(65) Prior Publication Data

US 2008/0008218 A1 Jan. 10, 2008

(30) Foreign Application Priority Data

Jul. 5, 2006 (TW) .............................. 95124428 A

(51) Int. Cl.
*H01L 33/00* (2010.01)

(52) U.S. Cl. ............................ 257/98; 257/79; 257/88; 362/240; 362/248

(58) Field of Classification Search ................... 257/79, 257/88, 98, 675; 362/240, 248, 294
See application file for complete search history.

(56) References Cited

U.S. PATENT DOCUMENTS 7,338,186 B1 * 3/2008 Wu et al. .................... 362/294
2004/0212991 A1 10/2004 Galli
2004/0213016 A1 10/2004 Rice
2007/0007539 A1 * 1/2007 Kim et al. ..................... 257/88
2007/0115658 A1 * 5/2007 Mueller et al. .............. 362/231
2007/0274093 A1 * 11/2007 Haim et al. ................. 362/561

FOREIGN PATENT DOCUMENTS

WO WO 2005/083804 A1 9/2005

* cited by examiner

*Primary Examiner*—Phuc T Dang
(74) *Attorney, Agent, or Firm*—Thomas, Kayden, Horstemeyer & Risley, LLP

(57) ABSTRACT

The invention discloses a light-emitting diode illuminating equipment. The light-emitting diode illuminating equipment of the invention includes a heat-dissipating plate device, a plurality of heat-dissipating fins, a plurality of diode light-emitting devices, and a plurality of bar-shaped heat-conducting devices with high heat-conducting coefficient. The heat-dissipating fins extend from a surface of the heat-dissipating plate device. By mounting the heat-conducting devices onto the surface of the heat-dissipating plate device and disposing them among the heat-dissipating fins, a heat produced in operation by each diode light-emitting device is distributed uniformly on the heat-dissipating plate device and the heat-conducting devices due to the high heat-conducting efficiency of the heat-conducting devices, and then it is dissipated such that the diode light-emitting devices have a consistent junction temperature to make a consistency of luminous efficiency and lifetime of the diode light-emitting devices.

13 Claims, 4 Drawing Sheets

ILLUMINATING EQUIPMENT OF HIGH-POWER AND CLUSTERED LIGHT-EMITTING DIODES COUPLED TO HIGH EFFICIENCY HEAT-SPREADING AND HEAT-DISSIPATING MODULE

BACKGROUND OF THE INVENTION

1. Field of the Invention

This present invention relates to a light-emitting diode illuminating equipment, and more particularly to the high-power light-emitting diode illuminating equipment with high efficiency heat-spreading and heat-dissipating structure.

2. Description of the Prior Art

A light-emitting diode (LED) has advantages of power saving, vibration resistance, fast response, production ability, and so on, so the illuminating equipment with light sources of LEDs is currently being studied and developed. When the current high-power LED emits continually in a period of time, there is a problem of over-high temperature so that the luminous efficiency of the LED is decreased and the luminance cannot be increased. Therefore, any product with high-power LEDs requires a good heat-conducting and heat-dissipating mechanism. In addition, the heat distribution of a conventional illuminating equipment with a plurality of LEDs in operation is not uniform so that the photoelectric effect of the LEDs sustains heat impact in the illuminating equipment to become decayed due to the over-high junction temperature and then the luminous efficiency decreases. Furthermore, if the illumination equipment dissipates heat non-uniformly, the lives of the LEDs in the illumination equipment will be different and the luminance of the whole illuminating equipment is indirectly affected.

Regarding the heat-dissipating problem, there is a method by dissipating heat with heat-dissipating fins currently. Please refer to FIG. 1A. FIG. 1A is a sketch diagram illustrating an apparatus 1 according to the method. The apparatus 1 includes a heat-dissipating plate device 11, a plurality of heat-dissipating fins 12, and a plurality of diode light-emitting devices 13. The heat-dissipating plate device 11 has a first surface 112 and a second surface 114 opposite to the first surface 112. The diode light-emitting devices 13 are disposed onto the first surface 112. The heat-dissipating fins 12 are formed on the second surface 114. Therefore, the heat produced by each of the diode light-emitting devices in operation is dissipated via the heat-dissipating plate device 11 and the heat-dissipating fins 12. In order to dissipate the heat uniformly, the distances from the ends of the heat-dissipating fins 12 to the second surface 114 are different. As shown in FIG. 1A, the middle heat-dissipating fins 12 are longer and can dissipate more heat than the sideward heat-dissipating fins 12, with the aim to avoid the occurrence of hot spot that causes the photoelectric effect of diode light-emitting devices 13 under heat impact to decay first and then to decrease the luminous efficiency. However, only the heat-dissipating fins 12 is still unable to dissipate heat uniformly since the temperature difference may be 10% or more, and the heat-dissipating efficiency is not good, so as to occur hot spots. Thus, the mentioned problem still remains unsolved.

Another solution is to dissipate heat by use of a vapor chamber. Please refer to FIG. 1B. FIG. 1B is a sketch diagram illustrating an apparatus 2 according to the method. The apparatus 2 includes a heat-dissipating plate device 21, a plurality of heat-dissipating fins 22, a plurality of diode light-emitting devices 23, and a vapor chamber. The heat-dissipating plate device 21 has a first surface 212 and a second surface 214 opposite to the first surface 212. The vapor chamber 24 is disposed onto the first surface 212. The diode light-emitting devices 23 are disposed onto the vapor chamber 24. The heat-dissipating fins 22 are formed on the second surface 214. Compared with the above apparatus 1, the apparatus 2 solves the problem of the non-uniform temperature distribution, but the cost of the vapor chamber 24 is too high and it is not easy to make, so that the apparatus 2 is not suitable for application. Accordingly, there is a need to provide a light-emitting diode illuminating equipment with high power, high heat-spreading efficiency, and uniform heat dissipation, so as to solve the problems mentioned above.

SUMMARY OF THE INVENTION

A scope of the invention is to provide a light-emitting diode illuminating equipment with high power, high heat-spreading efficiency, and uniform heat dissipation.

According to a preferred embodiment, a light-emitting diode illuminating equipment of the invention includes a heat-dissipating plate device, a plurality of heat-dissipating fins, N first diode light-emitting devices, M second diode light-emitting devices, and a plurality of bar-shaped heat-conducting devices with high heat-conducting coefficient. N is an integer larger or equal to 3. M is a natural number. The heat-dissipating plate device includes a first surface and a second surface opposite to the first surface. The heat-dissipating fins extend from the second surface of the heat-dissipating plate device. The N first diode light-emitting devices are disposed onto the first surface of the heat-dissipating plate device and form an area. Each of the first diode light-emitting devices converts an electric energy into a first light. The M second diode light-emitting devices are disposed onto the first surface of the heat-dissipating plate device and arranged in the area. Each of the second diode light-emitting devices converts the electric energy into a second light. The bar-shaped heat-conducting devices with high heat-conducting coefficient are tightly attached to the second surface of the heat-dissipating plate device and arranged among the heat-dissipating fins such that the heat produced by each diode light-emitting device is distributed uniformly on the heat-dissipating plate device and the heat-conducting devices. The heat is then dissipated by the heat-dissipating plate device and the heat-dissipating fins such that the diode light-emitting devices on the first surface have a consistent junction temperature to make a consistency of luminous efficiency and lifetime of the diode light-emitting devices.

Accordingly, a light-emitting diode illuminating equipment of the invention has advantages of high power and high heat-dissipating efficiency, and moreover, distributes heat uniformly so as to maintain a consistency of the luminous efficiency and lifetime of the diode light-emitting devices.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1A:
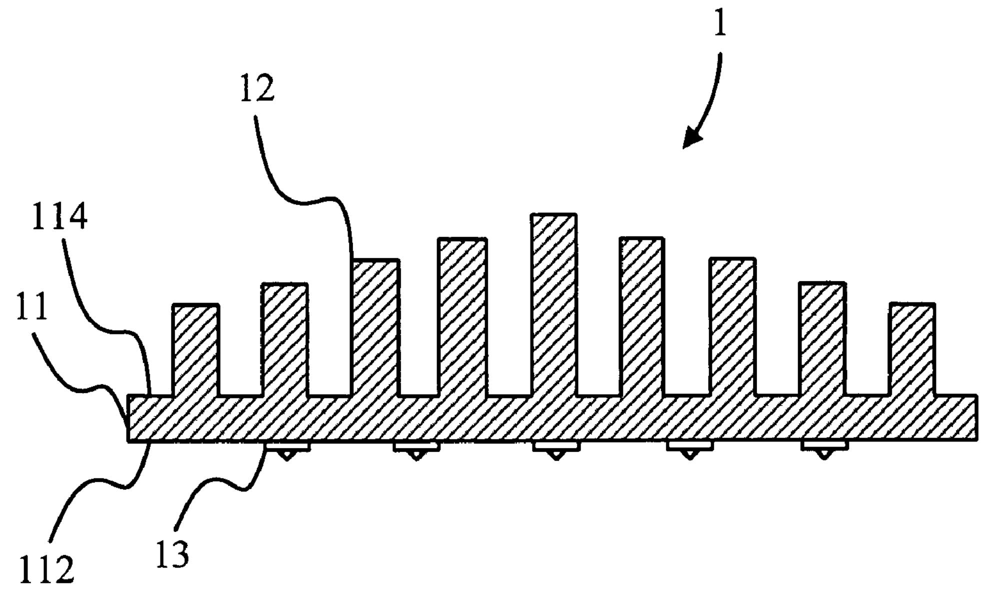
FIG. 1A (prior art)
FIG. 1A is a sketch diagram illustrating an apparatus according to a method for dissipating heat with heat-dissipating fins.
Figure 1B:
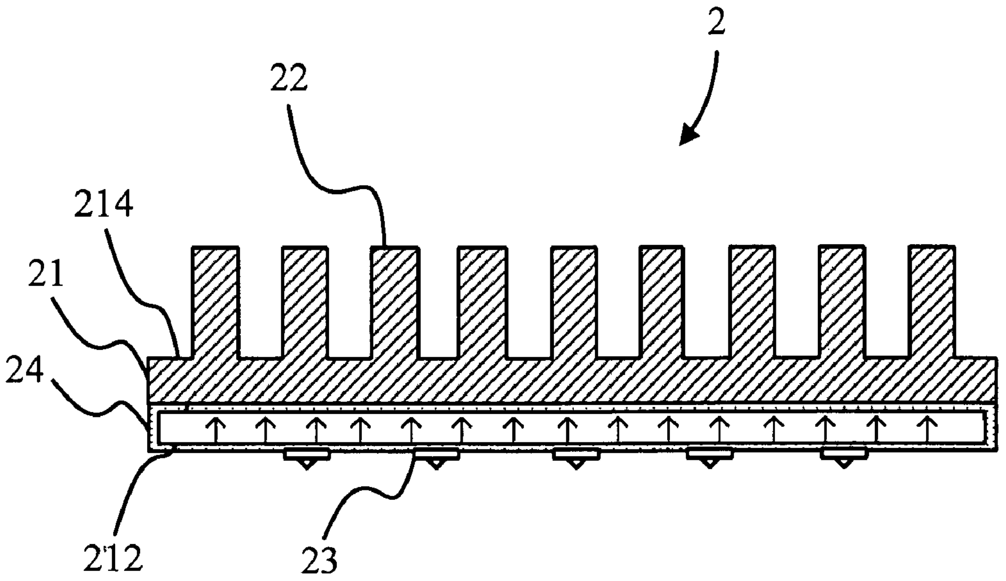
FIG. 1B (prior art)
FIG. 1B is a sketch diagram illustrating an apparatus according to a method for dissipating heat with a vapor chamber.
Figure 2:
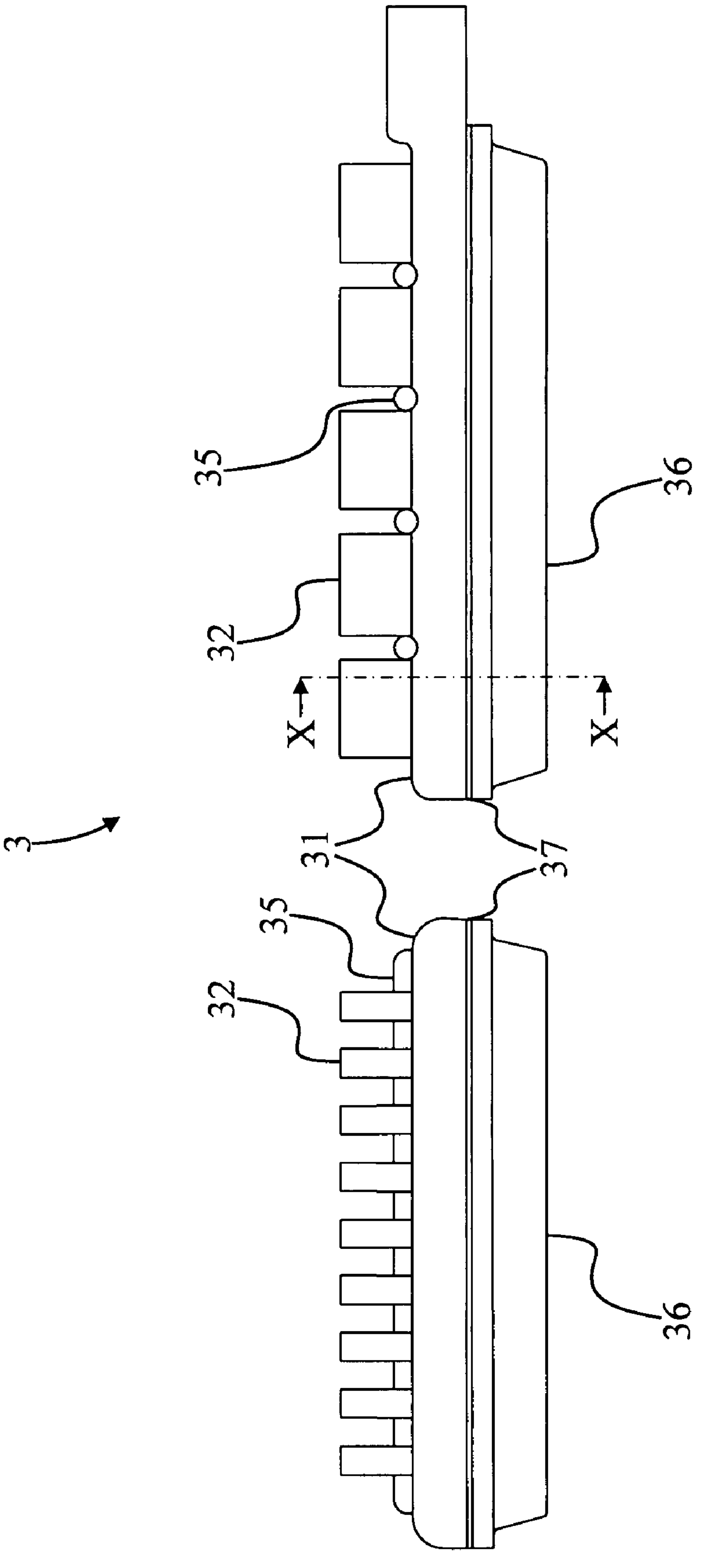
FIG. 2 illustrates a light-emitting diode illuminating equipment of a first preferred embodiment according to the invention.
Figure 3:
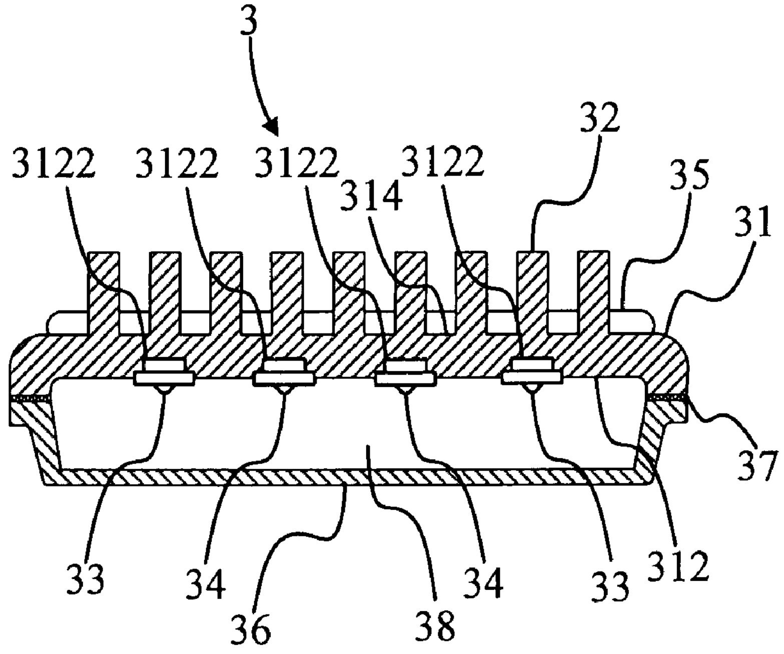
FIG. 3 is a cross section along the line X-X in FIG. 2.

Please refer to FIG. 2 and FIG. 3. FIG. 2 illustrates a light-emitting diode illuminating equipment 3 of a first preferred embodiment according to the invention. FIG. 3 is a cross section along the line X-X in FIG. 2. According to the first preferred embodiment, the light-emitting diode illuminating equipment 3 of the invention includes a heat-dissipating plate device 31, a plurality of heat-dissipating fins 32, N first diode light-emitting devices 33, M second diode light-emitting devices 34, a plurality of bar-shaped heat-conducting devices 35 with high heat-conducting coefficient, a shield device 36, and a heat-isolating ring 37. N is an integer larger or equal to 3. M is a natural number.

The heat-dissipating plate device 31 includes a first surface 312 and a second surface 314 opposite to the first surface 312. The heat-dissipating fins 32 extend from the second surface 314 of the heat-dissipating plate device 31. The heat-dissipating plate device 31 includes N first cavities 3122 formed on the first surface 312 and M second cavities 3124 formed on the first surface 312. Each of the first diode light-emitting devices 33 corresponds to one of the first cavities 3122 and is disposed in the corresponding first cavity 3122. The first diode light-emitting devices 33 enclose into an area S (not shown in FIG. 2). Each of the second diode light-emitting devices 34 corresponds to one of the second cavities 3124, is disposed in the corresponding second cavity 3124, and is arranged in the area S. The bar-shaped heat-conducting devices 35 with high heat-conducting coefficient are tightly attached to the second surface 314 of the heat-dissipating plate device 31 and arranged among the heat-dissipating fins 32.

Each of the first diode light-emitting devices 33 converts an electric energy into a first light. Each of the second diode light-emitting devices 34 converts the electric energy into a second light. Moreover, one of the first diode light-emitting devices 33 includes at least one light-emitting diode chip or at least one laser diode chip. One of the second diode light-emitting devices 34 includes at least one light-emitting diode chip or at least one laser diode chip.

The shield device 36 is engaged to a circumference of the heat-dissipating plate device 31 by a heat-isolating ring 37 to form a sealed space 38 for accommodating the first diode light-emitting devices 33 and the second diode light-emitting devices 34. The shield device 36 includes a transparent shield which allows the light emitted by each of the first diode light-emitting devices 33 and the second diode light-emitting devices 34 to pass through.

Because the bar-shaped heat-conducting devices 35 with high heat-conducting coefficient are tightly attached to the second surface 314 of the heat-dissipating plate device 31 and arranged among the heat-dissipating fins 32, the heat produced in operation by each of the first diode light-emitting devices 33 and each of the second diode light-emitting devices 34 is distributed uniformly on the heat-dissipating plate device 31. The heat is then dissipated by the heat-dissipating plate device 31 and the heat-dissipating fins 32. Each of the bar-shaped heat-conducting devices 35 with high heat-conducting coefficient could be a heat pipe or a vapor chamber.

Figure 4:
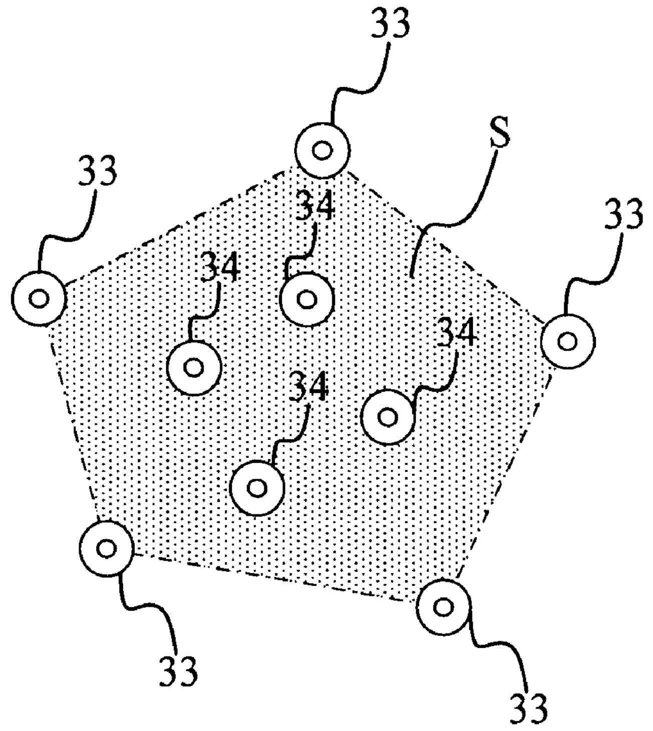
FIG. 4 is a configuration diagram of the diode light-emitting devices of the preferred embodiment.

It should be noted that the area S enclosed by the first diode light-emitting devices 33 is represented as a convex polygon, the first diode light-emitting devices 33 are located at the boundary of the area S, and the second diode light-emitting devices 34 are located in the area S to form a cluster configuration, which is shown in FIG. 4. In this case, although the luminance can be increased, each of the second diode light-emitting devices 34 will be surrounded by other sources, that is the other diode light-emitting devices 33 and 34, which easily forms hot spots so as to make the chip junction temperature of the second diode light-emitting devices 34 overheated to shorten the lifetime, affects the luminous efficiency, and indirectly affects the luminance of the light-emitting diode illuminating equipment 3. However, according to the first preferred embodiment, the light-emitting diode illuminating equipment 3 of the invention increases the heat-conducting efficiency by disposing the diode light-emitting devices 33 and 34 directly onto the first surface 312 of the heat-dissipating plate device 31. Furthermore, the light-emitting diode illuminating equipment 3 makes the heat distributed uniformly by tightly attaching the bar-shaped heat-conducting devices 35 with high heat-conducting coefficient onto the second surface 314 of the heat-dissipating plate device 31 and getting them disposed among the heat-dissipating fins 32, such that the heat is dissipated rapidly by the heat-dissipating plate device 31 and the heat-dissipating fins 32.

According to the first preferred embodiment, the light-emitting diode illuminating equipment 3 further comprises a circuit board. The circuit board is mounted on the first surface 312 and includes a plurality of bond pads and a plurality of holes. Therein, each of the first diode light-emitting devices 33 and the second diode light-emitting devices 34 corresponds to one of the holes and is disposed onto the first surface 312 of the heat-dissipating plate device 31 through said hole, and the bond pads provide electric connection between of the circuit board and each of the first diode light-emitting devices 33 and the second diode light-emitting devices 34.

The light-emitting diode illuminating equipment 3 further includes a control circuit. The control circuit is electrically coupled to the first diode light-emitting devices 33 and the second diode light-emitting devices 34 respectively so as to control emitting of the first diode light-emitting devices 33 and the second diode light-emitting devices 34. Therein, the control circuit could be disposed inside the sealed space 38 or outside the sealed space 38.

Figure 5:
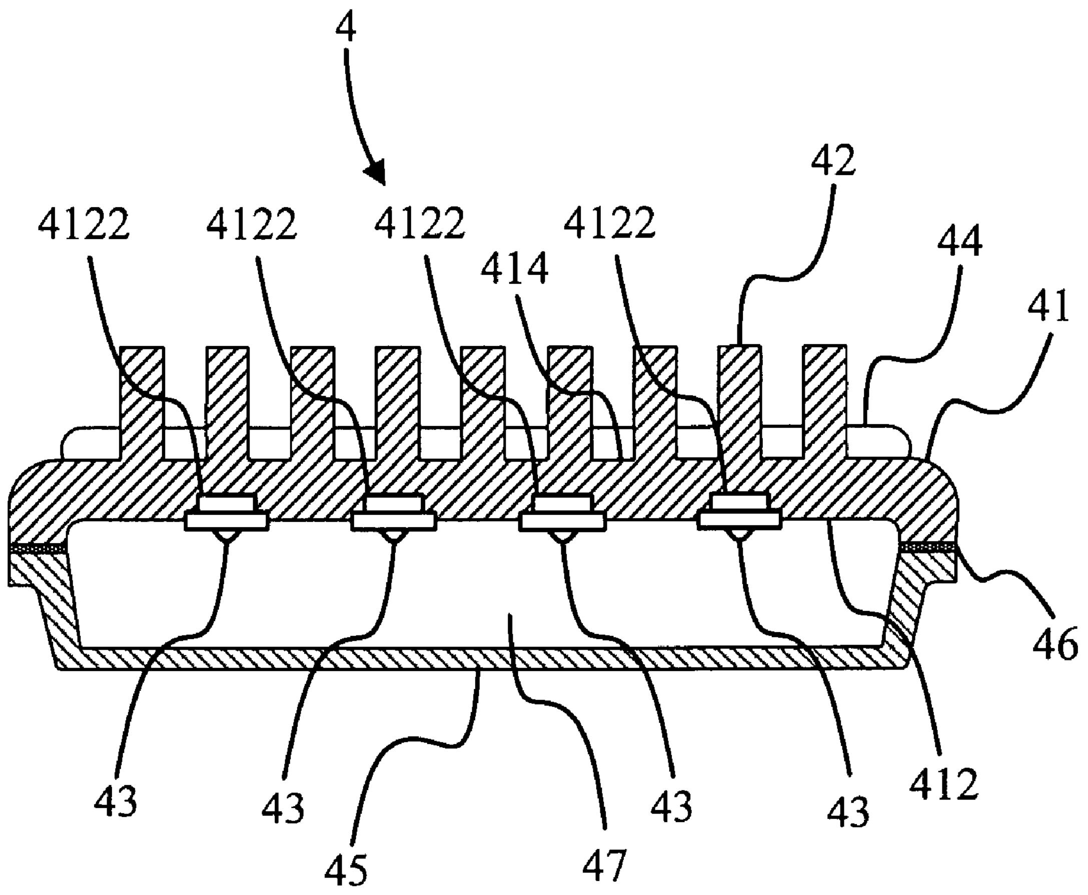
FIG. 5 is a cross section of a light-emitting diode illuminating equipment of a second preferred embodiment according to the invention.

Please refer to FIG. 5. FIG. 5 is a cross section of a light-emitting diode illuminating equipment 4 of a second preferred embodiment according to the invention. According to the second preferred embodiment, the light-emitting diode illuminating equipment 4 includes a heat-dissipating plate device 41, a plurality of heat-dissipating fins 42, N diode light-emitting devices 43, a plurality of heat-conducting devices 44, a shield device 45, and a heat-isolating ring 46. N is an integer larger or equal to 3.

The heat-dissipating plate device 41 includes a first surface 412 and a second surface 414 opposite to the first surface 412. The heat-dissipating fins 42 extend from the second surface 414 of the heat-dissipating plate device 41. The heat-dissipating plate device 41 includes N first cavities 4122 formed on the first surface 412. Each of the diode light-emitting devices 43 is correspondingly disposed in one of the first cavities 4122. The heat-conducting devices 44 are tightly attached to the second surface 414 of the heat-dissipating plate device 41 and disposed among the heat-dissipating fins 42. Furthermore, a third diode light-emitting device 43 of the diode light-emitting devices 43 includes a light-emitting diode chip or at least one laser diode chip.

The shield device 45 is engaged to a circumference of the heat-dissipating plate device 41 by a heat-isolating ring 46, so as to form a sealed space for accommodating the diode light-emitting devices 43. The shield device 45 includes a transparent shield which the light emitted by each of the diode light-emitting devices 43 can pass through.

Because the heat-conducting devices 44 are tightly attached to the second surface 414 of the heat-dissipating plate device 41 and arranged among the heat-dissipating fins 42, the heat produced in operation by each of the diode light-emitting devices 43 is distributed uniformly on the heat-dissipating plate device 41. The heat is then dissipated by the heat-dissipating plate device 41 and the heat-dissipating fins 42. It is an additional notice that the heat-conducting devices 44 can also be disposed on the first surface 412. Moreover, the heat-dissipating plate device 41 includes a plurality of recesses whereby the heat-conducting devices 44 can be tightly attached on the first surface 412. One of the heat-conducting devices 44 could be a heat pipe or a vapor chamber. Moreover, when a first diode light-emitting device 43 and a second diode light-emitting device 43 of the diode light-emitting device 43 are both driven at a current, the surface temperature difference between the first diode light-emitting device 43 and the second diode light-emitting device 43 could be controlled within a certain range. The range is determined by the configuration of the heat-dissipating device 44 disposed on the second surface 414 of the heat-dissipating plate device 41. In general, the range could be controlled with a range of 10 degrees Centigrade, and if with heat simulation, it could be controlled within a range of 5 degrees Centigrade or even a smaller range.

It is noted that, according to the second preferred embodiment, the temperature control for the light-emitting chips affects the luminous efficiency and the lifetime thereof. Furthermore, the inspection of the temperature control depends on the temperature measurement. However, the junction temperature is not easy to be measured by current technologies. Instead, in order to execute the temperature control, the invention measures the surface temperatures of the diode light-emitting devices representing the injunction temperatures thereof. The surface temperature could be measured by use of thermal couple, infrared ray, or other devices capable of measuring the surface temperature directly or indirectly. In addition, the temperature instead of the junction temperature is not limited to the surface of the diode light-emitting device. Other temperatures relative to the injunction temperature directly or indirectly are allowable. If possible, it is practicable to put a temperature measure circuit into the light-emitting diode process.

According to the second preferred embodiment, the light-emitting diode illuminating equipment 4 further includes a circuit board. The circuit board is mounted on the first surface 412 and includes a plurality of bond pads and a plurality of holes. Therein, each of the diode light-emitting devices 43 corresponds to one of the holes, and the bond pads provide electrically conducting of the N diode light-emitting devices 43 to the circuit board.

The light-emitting diode illuminating equipment 4 further includes a control circuit. The control circuit is electrically coupled to the N diode light-emitting devices 43 respectively. Therein, the control circuit is disposed inside the sealed space 47, or outside the sealed space 47.

Therefore, according to the preferred embodiments, the light-emitting diode illuminating equipment of the invention has both a high power luminance and a high efficiency of heat-spreading and heat-dissipating. Furthermore, the junction temperatures of the diode light-emitting devices are consistent, and the temperature difference of those could be controlled in a certain range so as to make a consistency of luminous efficiency and lifetime of the light-emitting diode chips.

In addition, the configuration of the bar-shaped heat-conducting devices 35 and 44 with high heat-conducting coefficient disposed on the second surface 314 and 414 of the heat-dissipating plate device 31 and 41 is not limited to the displays in figures. The configuration could be designed depending on a real product. Therefore, it is allowable to represent the bar-shaped heat-conducting, devices 35 and 44 with high heat-conducting coefficient in radius or in a certain shape depending on experiments.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A light-emitting diode illuminating equipment, comprising: a heat-dissipating plate device having a first surface and a second surface; a plurality of heat-dissipating fins extending from the second surface of the heat-dissipating plate device; N diode light-emitting devices, N being a integer larger than 3, the N diode light-emitting devices being disposed on the first surface of the heat-dissipating plate device in two-dimensional distribution; and a plurality of heat-conducting devices attached on the heat-dissipating plate device, wherein a first diode light-emitting device of the N diode light-emitting devices and a second diode light-emitting device of the N diode light-emitting devices are driven by circuit, a surface temperature difference between the first diode light-emitting device and the second diode light-emitting device is less than 10 degrees Centigrade.

2. The light-emitting diode illuminating equipment of claim 1, wherein one of the heat-conducting devices is a heat pipe or a vapor chamber.

3. The light-emitting diode illuminating equipment of claim 1, wherein the heat-dissipating plate device comprises N cavities, each of the diode light-emitting devices is correspondingly disposed in one of the N cavities.

4. The light-emitting diode illuminating equipment of claim 1, wherein a third diode light-emitting device of the N diode light-emitting devices comprises a light-emitting diode chip or a laser diode chip.

5. The light-emitting diode illuminating equipment of claim 4, further comprising a circuit board, the circuit board comprising a plurality of bond pads and N holes, wherein each of the diode light-emitting devices corresponds to one of the holes, and the bond pads provide electrically conducting of the N diode light-emitting devices to the circuit board.

6. The light-emitting diode illuminating equipment of claim 1, further comprising a shield device configured to engaged to a circumference of the heat-dissipating plate device to form a sealed space for accommodating the N diode light-emitting devices, the shield device comprising a transparent shield which the light emitted by each of the first diode light-emitting devices can pass through.

7. The light-emitting diode illuminating equipment of claim 6, wherein the shield device is engaged to the circumference of the heat-dissipating plate device by a heat-isolating ring.

8. The light-emitting diode illuminating equipment of claim 6, further comprising a control circuit electrically coupled to the N diode light-emitting devices so as to control emitting of the N diode light-emitting devices.

9. The light-emitting diode illuminating equipment of claim 8, wherein the control circuit is disposed inside the sealed space.

10. The light-emitting diode illuminating equipment of claim 8, wherein the control circuit is disposed outside the sealed space.

11. The light-emitting diode illuminating equipment of claim 1, wherein the heat-conducting devices are attached on the second surface of the heat-dissipating plate device and disposed among the heat-dissipating fins.

12. The light-emitting diode illuminating equipment of claim 1, wherein the heat-conducting devices are attached on the first surface of the heat-dissipating plate device.

13. The light-emitting diode illuminating equipment of claim 12, wherein the heat-dissipating plate device comprises a plurality of recesses whereby the heat-conducting devices are attached on the first surface of the heat-dissipating plate device, and the N diode light-emitting devices contacts the heat-conducting devices such that the N diode light-emitting devices are disposed on the first surface of the heat-dissipating plate device with a two-dimension distribution.

* * * * *